United States Patent
Estakhri et al.

[11] Patent Number: 5,953,737
[45] Date of Patent: Sep. 14, 1999

[54] METHOD AND APPARATUS FOR PERFORMING ERASE OPERATIONS TRANSPARENT TO A SOLID STATE STORAGE SYSTEM

[75] Inventors: Petro Estakhri, Pleasanton; Berhanu Iman, Sunnyvale, both of Calif.

[73] Assignee: Lexar Media, Inc., Fremont, Calif.

[21] Appl. No.: 09/111,414

[22] Filed: Jul. 7, 1998

Related U.S. Application Data

[63] Continuation-in-part of application No. 08/831,266, Mar. 31, 1997.

[51] Int. Cl.[6] .............................. G06F 12/12; G06F 12/02
[52] U.S. Cl. .............................. 711/103; 711/5; 711/156; 711/158; 711/172; 711/171
[58] Field of Search ................................ 711/5, 103, 156, 711/158, 172, 171

[56] References Cited

U.S. PATENT DOCUMENTS

| | | | |
|---|---|---|---|
| 5,479,633 | 12/1995 | Wells et al. ............................... | 711/103 |
| 5,592,415 | 1/1997 | Kato et al. ........................... | 365/185.01 |
| 5,809,558 | 9/1998 | Matthews et al. ...................... | 711/103 |
| 5,835,935 | 11/1998 | Estakhri et al. ......................... | 711/103 |
| 5,845,313 | 12/1998 | Estakhri et al. ......................... | 711/103 |

*Primary Examiner*—Reginald G. Bragdon
*Attorney, Agent, or Firm*—Maryam Imam

[57] ABSTRACT

In a digital system having a host, a controller device and at least one nonvolatile memory integrated circuit, such as a flash memory chip, a method and apparatus is disclosed for storing digital information, provided by the host, in the nonvolatile memory under the direction of the controller in an efficient manner so as to significantly improve system performance. The nonvolatile memory is organized into sequentially-numbered blocks. Each nonvolatile integrated circuit is assigned a predetermined number of sequential blocks and when a free block is solicited for storage of digital information provided by the host, the nonvolatile integrated circuit rather than the entire nonvolatile memory is searched for the free block. When the information stored in a block is being updated by the host, the nonvolatile integrated circuit assigned to that block is excluded from the search for the free block. Moreover, the nonvolatile integrated circuit having the greatest number of free blocks is used for searching of the free block and storing of the host-provided information to allow for equal use of the nonvolatile integrated circuits.

20 Claims, 5 Drawing Sheets

METHOD AND APPARATUS FOR PERFORMING ERASE OPERATIONS TRANSPARENT TO A SOLID STATE STORAGE SYSTEM

CROSS REFERENCE TO RELATED APPLICATIONS

This application is a continuation-in-part to a prior U.S. patent application entitled "MOVING SECTORS WITHIN A BLOCK OF INFORMATION IN A FLASH MEMORY MASS STORAGE ARCHITECTURE", having been assigned application Ser. No. 08/831,266 and filed on Mar. 31, 1997.

BACKGROUND OF THE INVENTION

1. Field of the Invention

This invention relates to the field of digital systems employing non-volatile memory and particularly flash memory as mass storage for computers, digital cameras and the like.

2. Description of the Prior Art

Recently, solid state memory has gained popularity for use in replacing mass storage units in various technology areas such as computers, digital cameras, modems and the like. For example, in digital cameras, the use of solid state memory, such as flash memory, replaces conventional films.

Flash memory is generally provided in the form of semiconductor devices (or chips) with each device made of a large number of transistor memory cells and each cell being individually programmable. The programming (or writing) and erasing of such a memory cell is limited to a finite number of erase-write cycles, which basically determines the lifetime of the device. Furthermore, an inherent characteristic of flash memory cells is that they must be erased and verified for successful erase prior to being programmed.

With the use of flash memory, however, the area of memory that once contained information must first be erased prior to being re-programmed. In a flash memory device, write and erase cycles are generally slow and can significantly reduce the performance of a system utilizing flash memory as its mass storage.

In applications employing flash memory devices, such as personal computers and digital cameras, a host writes and reads information to the flash memory devices through a controller device, which is commonly in the form of a semiconductor device. Such information is organized in sectors with each sector including user data information and overhead information and being generally 512 bytes in length. The controller, upon receiving sector information from the host, during a host-commanded write operation, writes the information to the flash memory devices in accordance with a predetermined sector organization. While the host may be accessing multiple sectors, each sector is written to the flash devices one at a time.

Currently, in computers wherein large files such as commercial software and user programs are stored within flash memory and in digital cameras wherein large picture files are stored within flash devices, the files are written one sector at a time within flash. Due to the latency associated with each write operation, the performance of these systems when storing large quantities of information is limited.

In storing and/or retrieving a data file (data files may be any computer files including commercial software, user program, word processor software document, spread sheet file and the like), a computer (or host) system provides what is referred to as the logical block address indicating the location of where the host believes the data file to exist within the mass storage. The host-provided address may be in the form of cylinder, head and sector (CHS), which is converted to a logical block address format upon receipt by the controller. The same applies to digital camera applications. The controller then translates the logical block address (LBA) into a physical block address (PBA) and uses the latter to access the data file within flash memory. Each time a data file is changed, the latest version of the file is stored in an available (or 'unused') location within the flash memory that is identified by a new physical location (or new PBA). Upon using much of the free or available locations within the flash memory for updated files, an erase operation may be needed to make available 'old' locations for storage of additional information. Since erase operations are time-consuming (as are write operations), there is a trade off of the frequency of performing erase operations to the time expended for searching for free locations within the flash memory as more and more locations are used prior to the next erase operation.

A variety of different algorithms may be employed for determining when an erase operation(s) will take place and as a function thereof, where within the flash memory (mass storage) the next available free block is located for storing the data file. This function is performed by the space manager unit of the controller device.

The space manager unit of the controller device maintains a table of information regarding the location of the most recent data within the flash memory in addition to the location of information that is considered 'old' (information which has been superseded) and not yet erased and/or 'defective' (location can not be used for storing information due to some kind of defect) or 'used' (currently contains up-to-date information). This table of information is stored and updated in a volatile memory location such as RAM either within or outside of the controller device. Each time information is accessed by the host, the space manager table is used to find out the location of the information that is to be written and/or read from the flash memory devices.

An example of such a table is shown in FIG. 1 at 10 where N rows are used to store information for N number of LBAs. Each of the N rows, 12, includes a virtual PBA (VPBA) field 14, and a flag field 16. The flag field 16 comprises of an 'old' flag field 18, a 'used' flag field 20 and a 'defect' flag field 22. The LBA is used to address a row 12 within the table 10 where a corresponding VPBA field 14 and a flag field 16 are stored. The VPBA field 14 indicates the location of a cluster, a group of blocks, within which a block of information may be located in the flash memory devices.

As shown in FIG. 1, there are N rows, one row per LBA with each LBA representing a block of information consisting of 16 sectors. That is, upon receipt of an address from the host, either in the form of CHS or LBA, the controller masks the 4 least significant bits (LSBs) of the host-provided address and shifts it to the right by 4 bits, which effectively divides the host-provided address by 16. The result of this operation is used as the LBA that points to each of the LBA rows 12 of table 10. The reason for the divide by 16 is due to a block of information stored within the flash memory devices consisting of 16 sectors. Where the flash memory devices collectively provide 32 Mbytes (each byte being 8 bits) of storage capacity, data may be organized into 4096 blocks with each block being 16 sectors. The table 10 shown in FIG. 1 will include 4096 rows (N=4096). In this respect, the entire capacity of the flash memory devices, collectively, is mapped into the rows of the table of the space manager.

Each time data, provided by the host, is to be written to the flash memory devices, a search is conducted by the space manager to find a free block, a block that is not old, used or defective.

The problem with such prior art systems is that all of the flash memory devices may have to be searched each time a free block is to be located. This approach severely effects the performance of such systems, particularly as blocks start to fill up prior to erasures thereof. To increase the frequency of erase operations, would again effect the performance of the system as erase operations are time-consuming functions.

For the foregoing reasons, there is a need within digital systems using solid state memory such as flash devices to decrease the amount of time associated with erase operations in such a way so as to increase system performance.

SUMMARY OF THE INVENTION

It is an object of the present invention to maximize the performance of a digital system using non-volatile memory, such as flash devices, by performing erase operations while writing information to the flash devices.

It is another object of the present invention to increase the performance of a digital system employing flash memory devices by making erase operations performed on flash memory devices transparent to the overall operation of the system.

It is yet another object of the present invention to use a method and apparatus of the type described herein to search for a free block within the flash memory device determined to have the greatest number of free block locations.

It is a further object of the present invention to use a method and apparatus of the type described herein wherein upon updating of information, to store the updated information in a flash device that is other than the flash device used to store the original information.

It is still another object of the present invention to store information in a block located in a flash memory device while erasing the 'old' blocks another flash memory device.

Briefly, a preferred embodiment of the present invention includes a digital system having a host, a controller device and at least one nonvolatile memory integrated circuit, such as a flash memory chip. A method and apparatus are presented for storing digital information, provided by the host, in the nonvolatile memory under the direction of the controller in an efficient manner so as to significantly improve system performance. The nonvolatile memory is organized into sequentiallynumbered blocks. Each nonvolatile integrated circuit is assigned a predetermined number of sequential blocks and when a free block is solicited for storage of digital information provided by the host, the nonvolatile integrated circuit rather than the entire nonvolatile memory is searched for the free block. Moreover, the nonvolatile integrated circuit having the greatest number of free blocks is used for searching of the free block and storing of the host-provided information. When the information stored in a block is being updated by the host, the nonvolatile integrated circuit assigned to that block is excluded from the search for the free block. Moreover, the nonvolatile integrated circuit having the greatest number of free blocks is used for searching of the free block and storing of the host-provided information to allow for equal use of the nonvolatile integrated circuits.

IN THE DRAWING

DETAILED DESCRIPTION OF THE PREFERRED EMBODIMENTS

Figure 1:
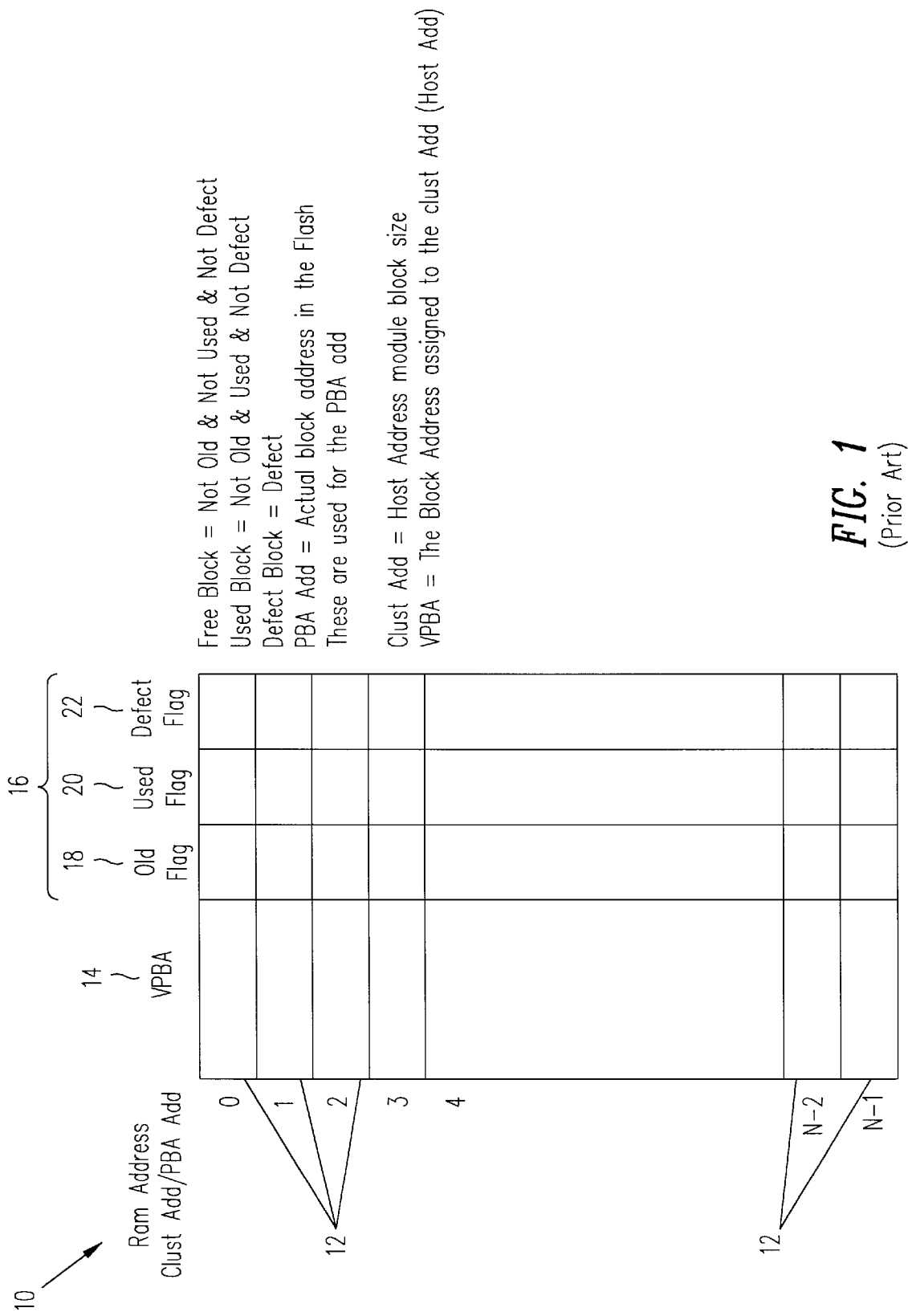
FIG. 1 shows a space manager table used in a prior art system.
Figure 2:
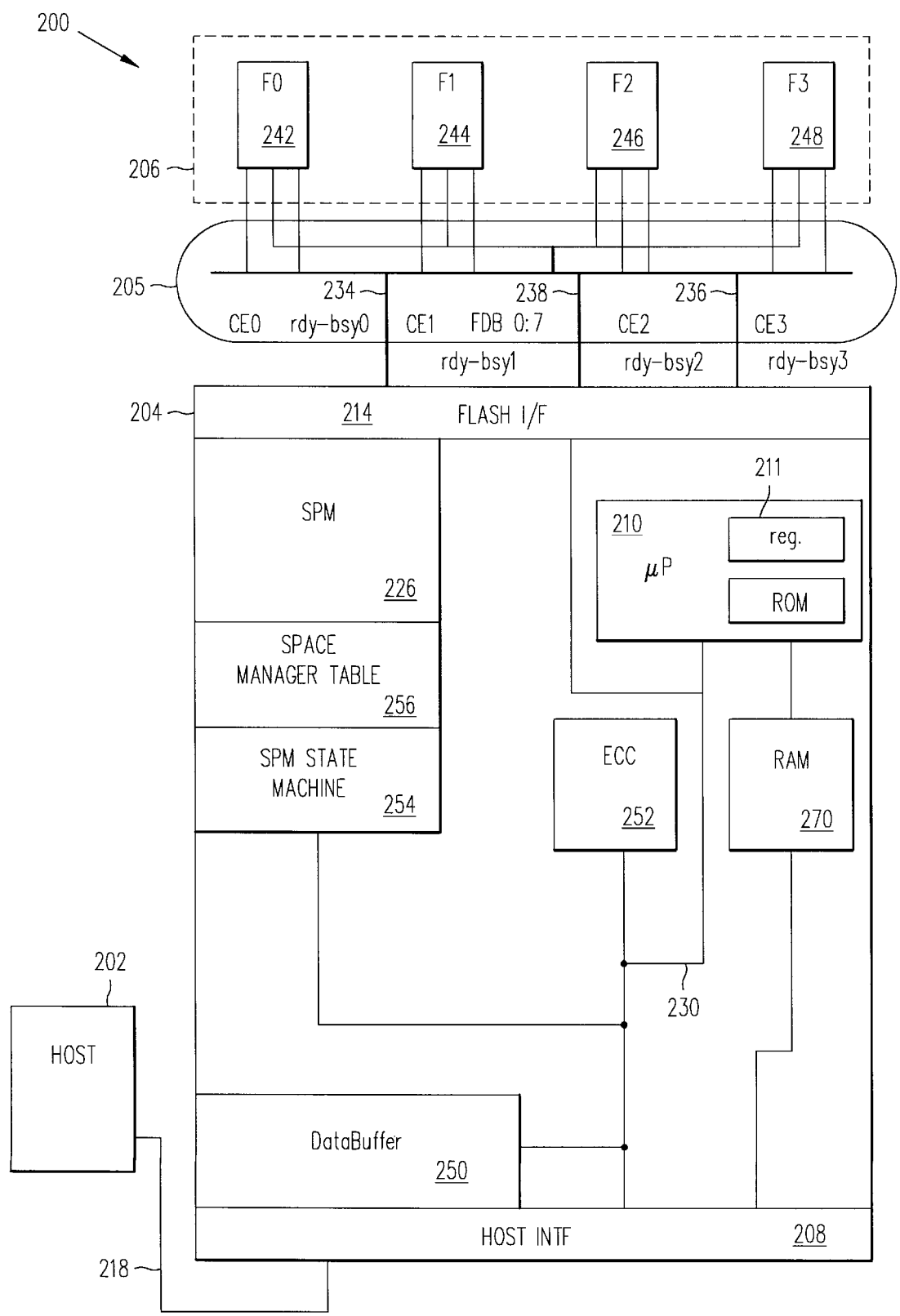
FIG. 2 shows an example of a digital system embodiment including a controller coupled to a host and a plurality of flash memory devices.

Referring now to FIG. 2, a digital system 200, which may be a computer (personal computer (PC)), digital camera, etc., is illustrated to include a host 202, a controller device 204 and a flash memory unit 206. Although not shown in detail, the host 202 includes a central processing unit (CPU), i.e., the "brain" of the digital system, coupled to access information through the controller device 204 from and to the memory unit 206 which, as depicted, is comprised of at least two flash memory devices in accordance with the present invention. Each of these devices may be an integrated circuit.

The host 202 is shown to communicate with the controller 204 through host bus 218 and the controller device 204 is shown coupled to the memory unit 206 through the memory signals 205.

The controller device 204 is an integrated circuit (or semiconductor) shown to include a host interface circuit 208, a microprocessor 210, and a flash interface circuit 214. The host interface 208 is depicted to be coupled to the host 202 through host bus 218, which includes an address bus, a bi-directional data bus and control signals (not shown separately). Depending on the architecture of the host being employed, the host address and data busses may be comprised of a single bus carrying both address and data information by multiplexing address and data signals onto the same bus. It should be noted that the term bus as used herein includes multiple electrical conductors or signal lines. The host bus 218 may be a PCMCIA interface, an ATA interface or other kinds of interfaces employed by the industry.

The host interface 208 is shown coupled to the host bus 218 and is further shown to be coupled through a microprocessor bus 230 to the microprocessor 210. Microprocessor 210 is further coupled to the flash interface 214 through the microprocessor bus 230, which facilitates communication of address and data information and control signals therebetween. The flash interface 214 includes a space manager block 226. The flash interface circuit 214 is coupled to the memory unit 206 through a flash address bus 234, a bidirectional flash data bus 236 and flash control signals 238.

In operation, the host 202 may be required to access the memory unit 206 during performance of various operations such as reading and writing. In doing so, the host 202 provides the address of a block of information it wishes to access (commonly referred to as the logical block address (LBA)) to the controller 204 through the host bus 218. In PC applications, a block of information is typically a sector as employed in conventional hard disk drives, with each sector typically having 512 bytes of data, although other-sized sectors may be similarly employed.

Microprocessor 210 executes instructions in the form of program code from a volatile memory structure (such as ROM (read-only memory) or RAM 270, (read-and-write memory)) located either within or outside of the microprocessor 210 block to instruct the space manager 226 to translate the LBA, provided by the host, to the next unused (or free) addressable storage block location available within the memory unit 206. The translated address is commonly referred to as a physical block address (PBA). The space manager may employ any one of a variety of algorithms to find the next available (or free) block located within the flash memory devices. An example of a space manager is disclosed in the earlier-referenced U.S. Pat. No. 5,485,595, the disclosure of which is herein incorporated by reference, particularly with reference to FIGS. 11–13, although other space management methods and apparatus may likewise be employed by the present invention.

The microprocessor 210 includes a register(s) 211 for maintaining track of the number of free blocks within each of the flash devices 242–248 of the memory unit 206. This register may be a register file or any other kind of volatile storage space commonly employed by microprocessors for storage.

The PBA designated by the space manager 226 is communicated through the memory signals 205 to the memory unit 206. At this time, it should be noted that the flash interface circuit 214 is coupled to receive the LBA provided by the host (to the host interface circuit 208) through the microprocessor bus 230. Memory unit 206 generally includes a plurality of nonvolatile memory devices, such as flash or EEPROM type of memory, (these devices may also each be a chip or integrated circuit as commonly referred to in the industry), labeled as 242–248 (in FIG. 2).

Each one of the nonvolatile devices, shown in the preferred embodiment of FIG. 2, has a capacity of 4 Mbytes and is therefore capable of storing 8192 sectors with each sector being 512 bytes. Nonvolatile devices and blocks of alternative sizes may be similarly employed.

In FIG. 2, the controller 204 is further shown to include a data buffer 250, which is shown coupled through the microprocessor bus 230 to the microprocessor 210, the flash interface circuit 214 and the host interface 208, for temporary storage of the information stored and retrieved from the memory unit 206. An ECC block 252 is coupled through the microprocessor bus 230 to the microprocessor 210 and the data buffer 250 for operating on the data that is stored within the memory unit 206 for detection and correction of errors that may be included in the data.

The space manager 226 is coupled to the host interface circuit 208 through the microprocessor bus 230 as well as the flash interface circuit 214. The space manager 226 includes a space manager state machine 254 and a space manager table 256. The space manager state machine 254 operates, among other functions, to find the next available free space within the memory unit 206. The space manager table 256 is used for storing status information, such as location of stored information and availability of storage space within the memory unit 206, as will be discussed shortly in further detail.

The flash interface circuit 214 provides chip enable signals and ready/busy (rdy/bsy*) signals to the memory unit 206. In the embodiment shown in FIG. 2, the memory signals 205 include a plurality of control signals comprising chip enable signals and rdy/bsy* signals. Each of the chip enable signals and rdy/bsy* signals is coupled to one of the nonvolatile devices 242–248.

The chip enable signals, when active, select the nonvolatile device that is to be operated on by the controller 204. Since each nonvolatile device receives its own chip enable signal, the controller 204 can initiate a separate operation relative to each of nonvolatile devices and at the same time monitor those operations. For example, nonvolatile device 242 may be updated with information supplied by the host while nonvolatile device 244 is being erased.

The significance of having a separate rdy/bsy signal for each nonvolatile device is that the controller can monitor the status of each of the nonvolatile devices simultaneously without interfering with the operation of the other nonvolatile devices.

In an alternative embodiment, two rdy/bsy* signals may be used for operating all of the nonvolatile devices by coupling a first one of the rdy/bsy* signals to the even-numbered (or every other) nonvolatile devices and coupling a second one of the rdy/bsy signals to the odd-numbered nonvolatile devices. This decreases the number of signals needed between the controller 204 and the memory unit 206. The controller 204 then manages the write and erase operations based upon the even and odd numbering of the nonvolatile devices. The controller searches for the maximum number of free blocks available in the even and odd nonvolatile devices depending upon which nonvolatile device has an 'old' block thereby requiring erasing.

If the 'old' block that is to be erased is in one of the even-numbered nonvolatile devices, the controller searches for a free (or available) block within the odd-numbered nonvolatile devices so that simultaneous execution of erase and write operations on the memory unit 206 is effected.

Figure 3:
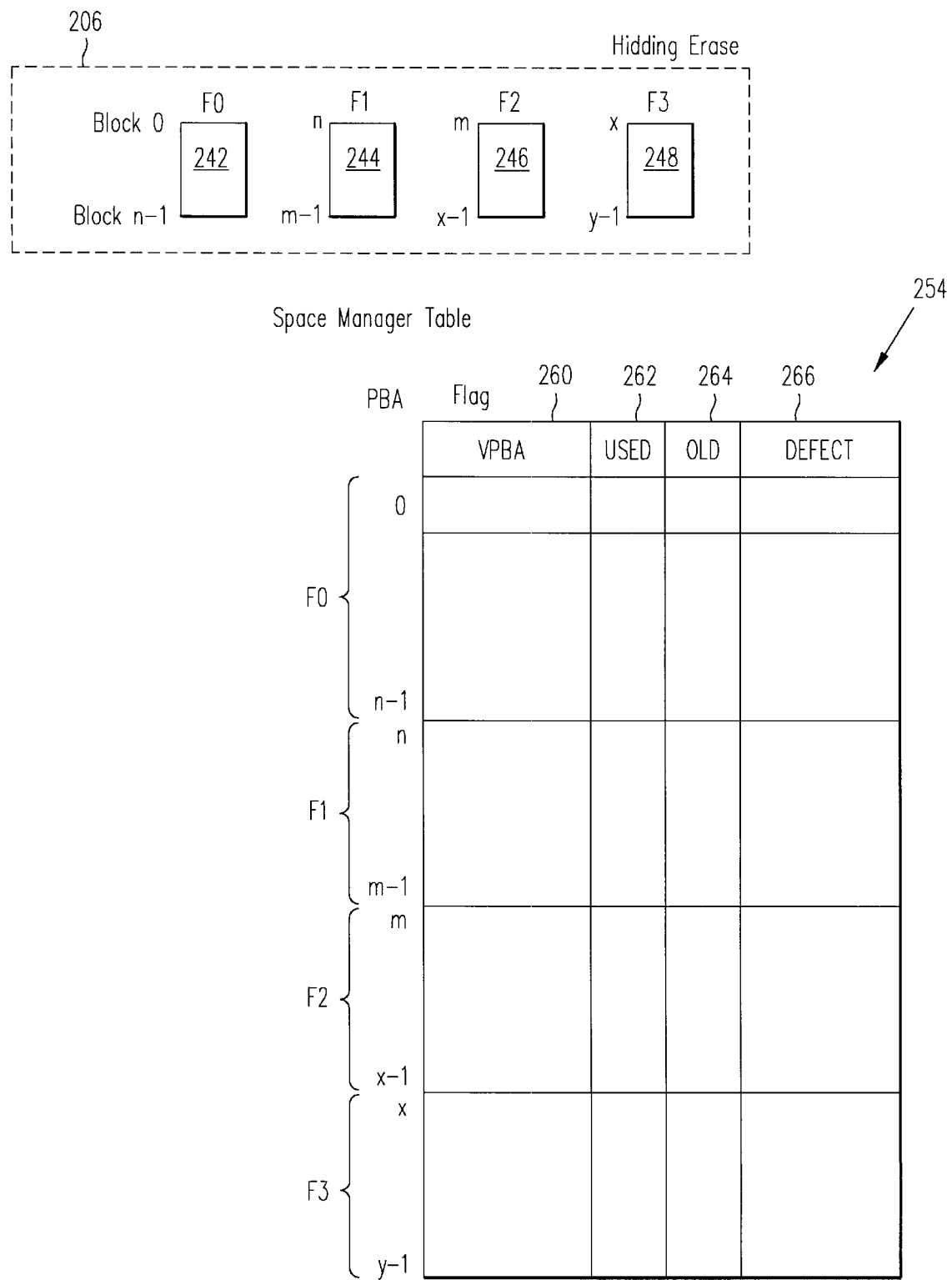
FIG. 3 depicts an example of the organization of a space manager table reflecting the mapping of the addresses assigned to the flash memory devices as used by the controller of FIG. 2.

FIG. 3 depicts the memory unit 206 in addition to the status of the information stored in the memory unit 206, as organized within the space manager table 254.

In an embodiment of the present invention, as shown in FIG. 3, the information in each of the nonvolatile devices 242–248 is organized into blocks with each block including 16 sectors, although alternatively, each block may include less or more number of sectors. Each nonvolatile device is shown to include a predetermined number of blocks, for example, nonvolatile device 242 includes n number of blocks, nonvolatile device 242 includes m number of blocks, nonvolatile device 246 includes x number of blocks and nonvolatile device 248 includes y number of blocks. While each nonvolatile device may include a different number of blocks than other nonvolatile devices, in the embodiment shown and discussed herein, each nonvolatile device includes the same number of blocks. For example, each nonvolatile device may include 1024 blocks such that the memory unit 206 has the capacity to store 4096 blocks or 32 Mbytes of information (each block having 16 sectors and each sector having 512 bytes).

The table 254 is shown to include information regarding each block within the memory unit 206. The information for the blocks 0 through n-1 of the nonvolatile device 242 is stored at the top of the table 254, followed by remaining blocks of the nonvolatile devices 244–248.

Each row of the table 254 contains fields of information regarding the status of the blocks within the memory unit 206. Specifically, a virtual physical block address (VPBA) field 260 includes address information regarding the location of the corresponding block within the memory unit 206. Each row of the table 254 further includes flag fields such as a 'used' flag field 262, an 'old' flag field 264 and a 'defect' flag field 266. The 'used' flag field maintains flag information which indicates whether or not the corresponding block within the memory unit 206 is free. When set, this flag indicates that the corresponding block contains information.

The 'old' flag field 264 represents information regarding whether or not information of the corresponding block has been superseded such that the most recent information now resides in another block within the memory unit 206. The 'defect' flag field 266 contains information regarding whether or not the corresponding block within the memory unit 206 is defective. The information within the table 254 is updated by the microprocessor 210 (in FIG. 2).

Figure 4A:
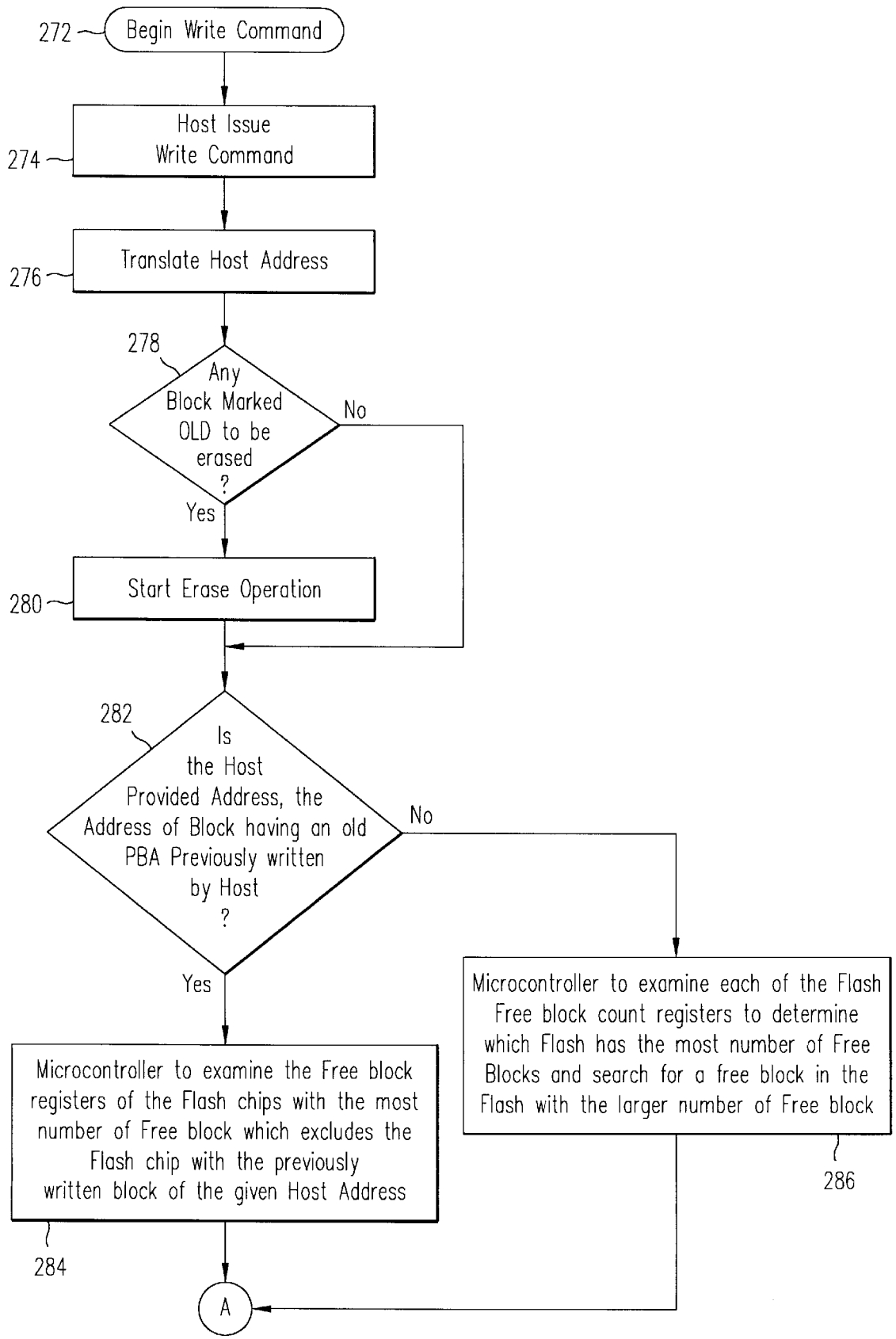
FIGS. 4a and 4b depict in flow chart form, an example of the operations performed by the controller of FIG. 1 during a write operation during which an erase operation is also performed.
Figure 4B:
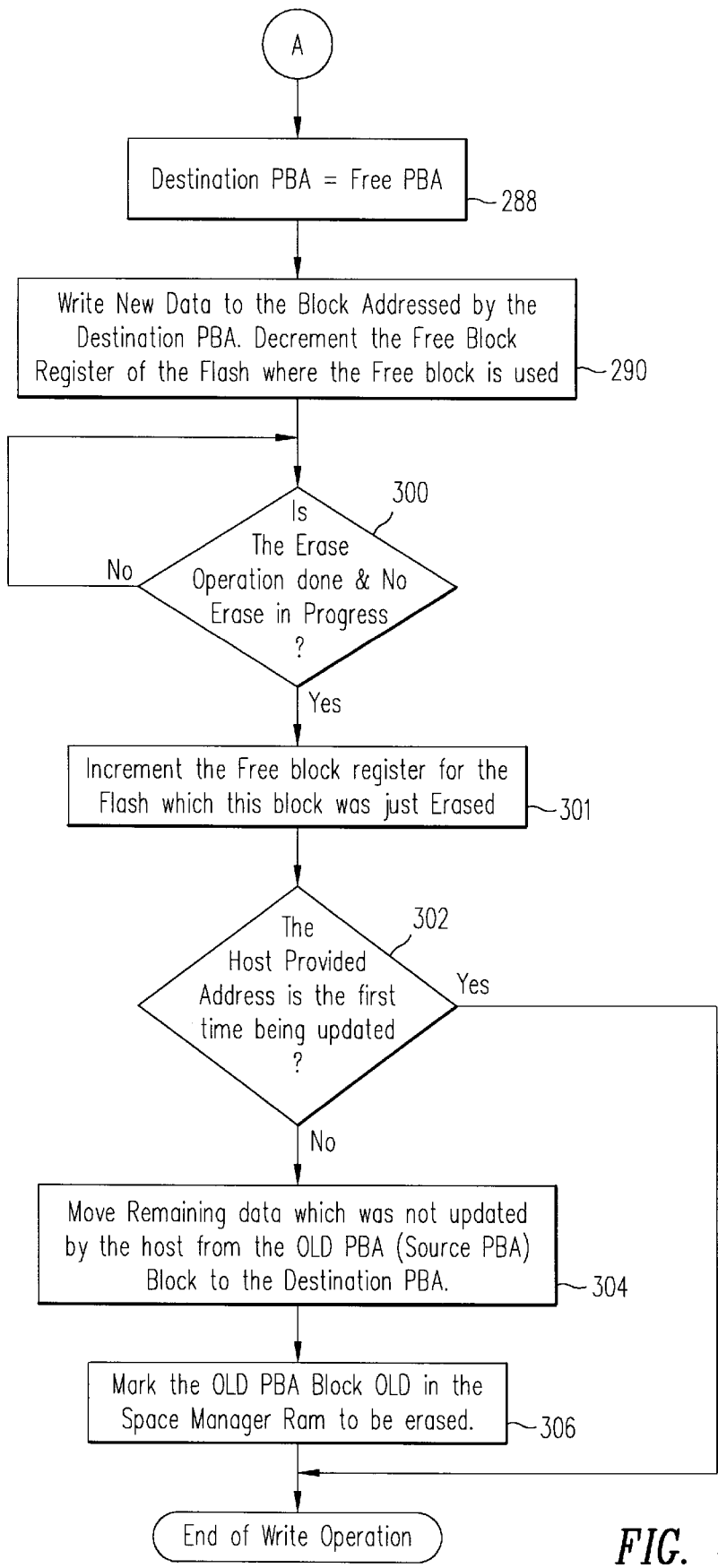

Referring now to FIGS. 4a and 4b, a flow chart is shown of the steps performed in carrying out a write operation. Most of these steps are performed by the microprocessor 210 (in FIG. 2) by executing the program stored in either the ROM or a RAM device 270 (in FIG. 2).

In FIG. 4a, at 272, a write operation begins and the host 202 (in FIG. 2) issues a write command at step 274 to the controller 204 (in FIG. 2). The write command includes an address indicating the location that is to be written by the host in addition to the data being stored.

At step 276, the controller 204 (in FIG. 2), upon receipt of the write command, translates the host-provided address from a CHS format to an LBA format and operates to effectively divide that address by 16 by shifting and masking the 4 LSBs of the address as discussed earlier herein above.

At 278 the determination is made as to whether or not any of the blocks within the memory unit 206 are 'old' and need to be erased. This determination is made by the space manager 226 (in FIG. 2) by looking for the 'old' flag field 264 in table 254 (in FIG. 3) to be set for any of the blocks within the memory unit 206. This may be performed in the background without requiring a host-initiated command, although preferably waiting for a command from the host has certain advantages. Specifically, when the command from the host is a read command, and the address of the block being read is an 'old' PBA address, the controller services the host-initiated read command before starting an erase command. Otherwise, the controller has to first wait until the erase operation is completed prior to servicing the host-initiated read command and this adversely impacts system performance.

Referring back to FIG. 4a, at step 280, if any blocks are 'old', the information within the block has been superseded by new information. The erase operation is commenced erasing those blocks that are marked 'old'. However, if at 278 there are no blocks that are marked as 'old', the erase operation at step 280 is skipped. Next, it is determined at 282 whether the host-provided address is the address of a block that has been written to by the host prior to being erased. In such a case, the 'used' flag in the 'used' flag field 262 (in FIG. 3) of table 254 would be set for that particular block.

Assuming that the host-provided address is the address of a block that has been previously written to, the method presented in FIG. 4a is continued by performing step 284 of searching for a free block that has not been written to prior to the blocks last erasure. The free (or available) block is going to be located in one of the nonvolatile devices 242–248 wherein the greatest number of free blocks reside and which is other than the nonvolatile device that includes the previously written block. For example, if the previously-written block, as determined at 282 is within the nonvolatile device 242 (in FIG. 2), then the free block located at step 284 in FIG. 4a will be located in a nonvolatile device other than the nonvolatile device 242 and it will be located in one of the nonvolatile devices 244–248 wherein the greatest number of free blocks are located.

It should be noted that the number of free blocks within each of the nonvolatile devices 242–248 is maintained in a register(s) 211 ( in FIG. 2 as explained earlier) for each nonvolatile device and accessed by the microprocessor 210. Upon power-up, the microprocessor 210, by executing the program residing within the RAM 270 or the ROM initializes the registers 21 1 that maintain the number of free blocks for each of the nonvolatile devices to a value that represents the number of free blocks for each nonvolatile device by examining every block of the memory unit 206. This value excludes any defective blocks, but all remaining blocks would be included in the free block value or count for each chip, which the microprocessor 210 maintains.

Referring back to FIG. 4a, after 282, if the host-provided address is not the same as the block that was previously written to by the host, then step 286 is performed at which a search takes place for a free block within the memory unit 206 and particularly within one of the nonvolatile devices 242–248 that has the greatest number of free blocks. After steps 286 and 284, step 288 is performed at which the PBA associated with the free block that was found at steps 284 and 286 becomes the destination PBA. Accordingly, the VPBA field 260 (in FIG. 3) of table 254 contains the destination PBA corresponding to the free block. The destination PBA is located in a row of the table 254 that is identified by the LBA calculated at step 276. The destination PBA is ultimately provided to the memory unit 206 for use in identifying the block within which the new information (or host-provided data) will be stored.

At step 290 in FIG. 4b, the data provided by the host is written to the block addressed by the destination PBA within the memory unit 206. Also, the value representing the number of free blocks for the nonvolatile device in which the host-provided data is being written, is decremented a by one to reflect the current number of free blocks available within that nonvolatile memory device.

At 300, the erase operation is checked for completion; if still in progress, the process awaits completion of the erase operation. At step 301, the value representing the number of free blocks relative to the nonvolatile device in which the 'old' block was erased, is incremented by one. At 302, basically the same test that was performed at 282 in FIG. 4a is again performed to determine whether the block being written is the same as the block previously written prior to the last erase operation of the same block. If so, at step 304, the remaining information, if need be, is moved from the old block to the new block. That is, within the memory unit 206, any block data that was not updated during the storage of the host-provided data, is moved from the block addressed by the old PBA (the old PBA identifies the location of the block within the memory unit 206 that contained the previously-written host data) to the destination PBA.

For example, if certain sectors of a block (as discussed above, a block contains 16 sectors in the preferred embodiment, although others sizes of blocks may be employed using the present invention) have been previously written and are now being rewritten, the remaining sectors of the previously-written block that are not being updated need to be moved to corresponding sectors within the new block of the memory unit 206 where the host-provided data was written (this is actually the location of the free block). This move operation at step 304 may employ algorithms that were disclosed in a previously filed application and referred to hereinabove, entitled "MOVING SECTORS WITHIN A BLOCK OF INFORMATION IN A FLASH MEMORY MASS STORAGE ARCHITECTURE", assigned application Ser. No. 08/831,266, and filed on Mar. 31, 1997. The disclosure of this application is incorporated herein by reference.

Upon completion of the move operation at step 304, step 306 is performed during which the 'old' block where information was moved therefrom is marked as 'old' by setting the 'old' flag field 264 in table 254 (in FIG. 3). This indicates that the 'old' block within the memory unit 206 needs to be erased since its data has been superseded. This completes the write operation.

Upon power-up, the controller 204 (in FIG. 2) assigns a predetermined number of blocks to each of the nonvolatile memory devices 242–248 in accordance with the capacity of each device. This information is later used by the space manager to search only those blocks that are assigned to the device having the greatest number of free or available blocks, as described above.

Thus, the method and apparatus of the present invention as described hereinabove cause erase operations to be performed in the background during write operations thereby increasing system performance. Furthermore, during a write (or store) operation, a search for free blocks of the entire nonvolatile memory unit is avoided as is done by prior art systems. In the present invention, in the search for a free block is conducted only within one of the nonvolatile devices, i.e. the device with the greatest number of free blocks. This significantly improves system performance by avoiding a lengthy search and as more devices are added to obtain higher memory capacity, the reduction in the time to search for free blocks becomes even more notable. Moreover, by searching for a free block within the nonvolatile device having the greatest number of free blocks, there is a fairly equal usage of nonvolatile memory devices which is of significance due to the characteristics associated with flash or EEPROM type of memory cells in having a limited lifetime in effectively maintaining their storage capability.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What I claim is:

1. A method of storing information in a digital information storage system having a controller device, a memory unit having a plurality of nonvolatile memory devices, and a host for storing digital information in the memory unit under the direction of the controller, the memory unit being organized into blocks, each block identified by the controller using a logical block address (LBA) and being identified within the memory unit by a corresponding physical block address (PBA), comprising:

(a) assigning a predetermined number of blocks to each of the nonvolatile memory devices, each block being identified by an LBA;

(b) finding a number of free memory device blocks that are available for storage of digital information;

(c) receiving a write command including host-provided data and host-provided location information for identifying the host-provided data and storing the same in the memory unit;

(d) developing a current LBA using the host-provided location information;

(e) determining which of the nonvolatile memory devices has the greatest number of free memory device blocks;

(f) finding a free block available for storage of information within the nonvolatile memory device having the greatest number of free memory device blocks, the free block being identified by a free PBA; and (g) storing the host-provided data in the free block identified by the free PBA within the memory unit, wherein searching the entire memory unit to find the location of a free block is reduced to searching only within a nonvolatile memory device having the greatest number of free blocks.

2. A method of storing information as recited in claim 1 wherein the predetermined number of blocks assigned to each nonvolatile memory device is in sequential order.

3. A method of storing information as recited in claim 2 further including a step of checking for completion of an erase operation and if the erase operation is not complete, awaiting completion thereof.

4. A method of storing information as recited in claim 1 further including a step of determining whether or not any blocks within the memory unit require erasing and if so, starting an erase operation of at least one of those blocks.

5. A method of storing information as recited in claim 1 further including a step of determining whether or not the block identified by the current LBA was written to prior to the last time it was erased.

6. A method of storing information as recited in claim 1 further including a step of determining which nonvolatile memory device is assigned to the current LBA.

7. A method of storing information as recited in claim 5 or 6 wherein if the host-provided location was previously written to, excluding the nonvolatile memory device identified by the host-provided location from the determining step in step (e) such that storage of the host-provided data within the excluded nonvolatile memory device is avoided.

8. A method of storing information as recited in claim 1 further including a step of storing each of the number of free memory device blocks in a free block storage location.

9. A method of storing information as recited in claim 1 wherein the block identified by the current LBA is organized into one more sectors.

10. A method of storing information as recited in claim 9 wherein if the current LBA is associated with a block within the memory unit that is being updated, storing the host-provided data.

11. A method of storing information as recited in claims 9 or 10 wherein if less than all of the sectors of the current LBA block are being updated, moving the sectors of the current LBA block which are not updated to the block within the memory unit identified by a destination PBA.

12. A method of storing information as recited in claim 1 further including providing a volatile memory device for storage of a table addressed by the LBAs for storage of corresponding PBAs and storing the free PBA in a location of the table identified by the current LBA.

13. A method of storing information as recited in claim 12 further including providing flag fields for each LBA in the table for providing information regarding the status of blocks within the memory unit.

14. A machine readable storage device encoding instructions for executing the method as recited in claim 1.

15. In a nonvolatile storage system having a controller device coupled to a host and a memory unit having a plurality of nonvolatile memory devices for storage of digital information provided by the host in the memory unit under the direction of the controller, the memory unit being organized into blocks, each block being identified by the controller using a logical block address (LBA) and being identified within the memory unit, by a corresponding physical block address (PBA) developed by the controller, the controller comprising:

a host interface circuit for receiving a write command from the host including host-provided data and a host-provided location information for identifying the host-provided data and storing the same in the memory unit;

a processor circuit for assigning a predetermined number of blocks to each of the nonvolatile memory devices and for maintaining a number of free memory device blocks available for storage of digital information for each nonvolatile memory device, said processor operative to find the nonvolatile memory device having the greatest number of free blocks;

a space manager unit being responsive to said host-provided location information and being operative to develop a current LBA, said space manager unit further being operative to find a free block within the nonvolatile memory device having the greatest number of free blocks, for storage of said host-provided data therein, and for developing a free PBA for identifying the free block; and a flash interface circuit for storing the host-provided information in the free block identified by the free PBA within the memory unit, wherein searching the entire memory unit to find the location of a free block is reduced to searching only within a nonvolatile memory device having the greatest number of free blocks thereby increasing the performance of the storage system.

16. In a nonvolatile storage system as recited in claim 15 wherein the processor includes a free block storage space for storing the greatest number of free blocks for each nonvolatile memory device.

17. In a nonvolatile storage system as recited in claim 16 further including flash interface signals for providing coupling of the host-provided data and free PBA between the flash interface circuit and the memory unit.

18. In a nonvolatile storage system as recited in claim 17 wherein said flash interface signals further include control signals, said control signals being developed by the controller for causing one of the nonvolatile memory devices to be erased while information, provided by the host, is being stored in another nonvolatile memory device.

19. In a nonvolatile storage system, as recited in claim 15, wherein said space manager unit includes a volatile memory device for storage of a table addressed by LBAs for storage of corresponding PBAs.

20. In a nonvolatile storage system, as recited in claim 19, further including flash fields for each LBA in said table for maintaining status information for corresponding blocks of the memory unit.

\* \* \* \* \*